United States Patent
Tossoun et al.

(10) Patent No.: US 11,355,899 B2
(45) Date of Patent: Jun. 7, 2022

(54) SEMICONDUCTOR LASER DIODE INTEGRATED WITH MEMRISTOR

(71) Applicant: HEWLETT PACKARD ENTERPRISE DEVELOPMENT LP, Houston, TX (US)

(72) Inventors: Bassem Tossoun, Santa Barbara, CA (US); Di Liang, Santa Barbara, CA (US); John Paul Strachan, Milpitas, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 104 days.

(21) Appl. No.: 17/004,955

(22) Filed: Aug. 27, 2020

(65) Prior Publication Data

US 2022/0069541 A1 Mar. 3, 2022

(51) Int. Cl.
*H01S 5/026* (2006.01)
*H01L 45/00* (2006.01)
(Continued)

(52) U.S. Cl.
CPC ............ *H01S 5/0261* (2013.01); *H01L 45/10* (2013.01); *H01S 5/0225* (2021.01);
(Continued)

(58) Field of Classification Search
CPC ..... H01S 5/0225; H01S 5/0425; H01S 5/1096
(Continued)

(56) References Cited

U.S. PATENT DOCUMENTS 3,479,614 A * 11/1969 Arthur ..................... H01S 5/30
372/46.01
7,453,087 B2 * 11/2008 Iwasaki ............... H01L 29/7869
257/292

(Continued)

FOREIGN PATENT DOCUMENTS

CN 108665924 10/2018
KR 20160072558 6/2016
(Continued)

OTHER PUBLICATIONS

Emboras, A. et al.; "Nanoscale Plasmonic Memristor with Optical Readout Functionality"; < https://www.ncbi.nlm.nih.gov/pubmed/24256313> accessed Feb. 24, 2020; Nov. 22, 2013; 1 pg.
(Continued)

*Primary Examiner* — Tuan N Nguyen
(74) *Attorney, Agent, or Firm* — Sheppard Mullin Richter & Hampton LLP

(57) ABSTRACT

An optical device includes a light-emitting device integrated with a memory device. The memory device include a first electrode and a second electrode, and the light-emitting device includes a third electrode and the second electrode. In such configuration, a first voltage between the second electrode and the third electrode causes the light-emitting device to emit light of a first wavelength, and a second voltage between the first electrode and the second electrode while the memory device is at OFF state causes the light-emitting device to emit light of a second wavelength shorter than the first wavelength or while the memory device is at ON state causes the light-emitting device to emit light of a third wavelength longer than the first wavelength.

20 Claims, 6 Drawing Sheets

(51) Int. Cl.
  *H01S 5/042*   (2006.01)
  *H01S 5/0225*  (2021.01)
  *H01S 5/30*    (2006.01)
  *H01S 5/10*    (2021.01)

(52) U.S. Cl.
  CPC .......... *H01S 5/0425* (2013.01); *H01S 5/1096* (2013.01); *H01S 5/3013* (2013.01)

(58) Field of Classification Search
  USPC ....................................................... 372/38.05
  See application file for complete search history.

(56) References Cited

U.S. PATENT DOCUMENTS

| | | | |
|---|---|---|---|
| 7,991,253 | B2 | 8/2011 | Bratkovski et al. |
| 8,081,850 | B2 | 12/2011 | Beausoleil et al. |
| 9,843,160 | B1 * | 12/2017 | Schubert ............. H01S 5/18361 |
| 10,546,976 | B2 | 1/2020 | Matias et al. |
| 10,657,440 | B2 | 5/2020 | Abel et al. |
| 2020/0028074 | A1 | 1/2020 | Defferriere et al. |

FOREIGN PATENT DOCUMENTS

| | | |
|---|---|---|
| WO | WO-2020039171 | 2/2020 |
| WO | 2020/225471 A1 | 11/2020 |

OTHER PUBLICATIONS

Hill, M.T. et al.; "A Fast Low-Power Optical Memory Based on Coupled Micro-Ring Lasers"; Letters to Nature; Nov. 11, 2004; pp. 206-209; vol. 432; Nature Publishing Group.

Koch, U. et al.; "Optical Memristive Switches"; J Electroceram; Mar. 7, 2017; pp. 239-250; issue 39; Springer.

Miscuglio, M. et al.; "Roadmap on Material-function Mapping for Photonicelectronic Hybrid Neural Networks"; Oct. 10, 2019; pp. 1-22.

Alkabani et al., "OE-CAM: A Hybrid Opto-Electronic Content Addressable Memory", Nov. 3, 2019, 14 pages.

Barrios et al., "Silicon Photonic Read-Only Memory", Journal of Lightwave Technology, vol. 24, No. 7, Jul. 2006, pp. 2898-2905.

Blumenthal et al., "Integrated Photonics for Low-Power Packet Networking", IEEE Journal of Selected Topics in Quantum Electronics, vol. 17, No. 2, Mar.-Apr. 2011, pp. 458-471.

Grajower et al., "Non-Volatile Silicon Photonics Using Nanoscale Flash Memory Technology," Laser & Photonics Reviews 12.4, 2018, pp. 1700190-1-1700190-8.

Liang et al., "Electrically-pumped compact hybrid silicon microring lasers for optical interconnects", Optics Express, vol. 17, No. 22, Oct. 26, 2009, pp. 20355-20364.

Parra et al., "Non-volatile epsilon-near-zero readout memory." Optics letters 44.16, 2019, pp. 3932-3935.

Ríos et al., "Integrated all-photonic non-volatile multi-level memory," Nature Photonics 9.11, 2015, 24 pages.

Tait et al., "Multi-channel control for microring weight banks," Optics Express, vol. 24, No. 8, 2016, pp. 8895-8906.

Zhang et al., "All-optical non-volatile tuning of an AMZI-coupled ring resonator with GST phase-change material", Optics letters 43.22, 2018, 5 pages.

D. Novak et al.; "Radio-over-fiber technologies for emerging wireless systems"; Jan. 2016; 12 pages.

S. Srinivasan, D. Liang, and R. G. Beausoleil, "Heterogeneous SISCAP Microring Modulator for High-Speed Optical Communication," in 2020 European Conference on Optical Communications (ECOC), Dec. 2020, pp. 1-3. doi: 10.1109/ECOC48923.2020. 933322.

* cited by examiner

SEMICONDUCTOR LASER DIODE INTEGRATED WITH MEMRISTOR

DESCRIPTION OF RELATED ART

An optical memory mainly includes a metal-insulator-metal (MIM) structure. It is formed by growing a silicon oxide on the silicon substrate, and followed by forming a MIM structure thereon. A transition metal binary oxide is used as the main material, combined with a PN diode structure, to form a memristive memory cell.

The development of optical memristive switches has been on the path from the micro—to the atomic scale. Optical memristive switches exploit a reversible phase transition from insulating to metallic phase where certain metal dielectrics may be used as an active material. The phase transition can be activated by substrate heating, optical absorption, or electrical currents.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

The figures are not exhaustive and do not limit the present disclosure to the precise form disclosed.

DETAILED DESCRIPTION

A light-emitting device, such as a light-emitting diode (LED) and laser device, can be modulated with an electrical bias or heat. Techniques disclosed herein are directed to a light-emitting device integrated with an optical non-volatile memory device. In some embodiments, the light-emitting device may be made from III-V materials and is integrated on a silicon layers with thin dielectric layers. A memory device, e.g., a memristor, is simultaneously made from the same III-V, dielectric, and silicon layers.

Further, operations of the memristor can modulate the light-emitting device. When the light-emitting device is on, operating the memristor at the OFF state causes the wavelength of the light-emitting device to shift to a shorter wavelength (blueshift), while operating the memristor at the ON state causes the wavelength of the light-emitting device to shift to a longer wavelength (redshift). In one embodiment, when the same voltage is applied to the memristor at the ON and OFF states, the redshift may be greater than the blueshift. The optical device may also be controlled such that when the same voltage is applied to the memristor at the ON and OFF states, the blueshift may be greater than the redshift.

The disclosed is a combination of a light-emitting device and a memristor. In some embodiments, they share a semiconductor layer and a dielectric layer. The device structures allow the operations of the memristor to modulate the light-emitting device for redshift or blueshift.

Figure 1:
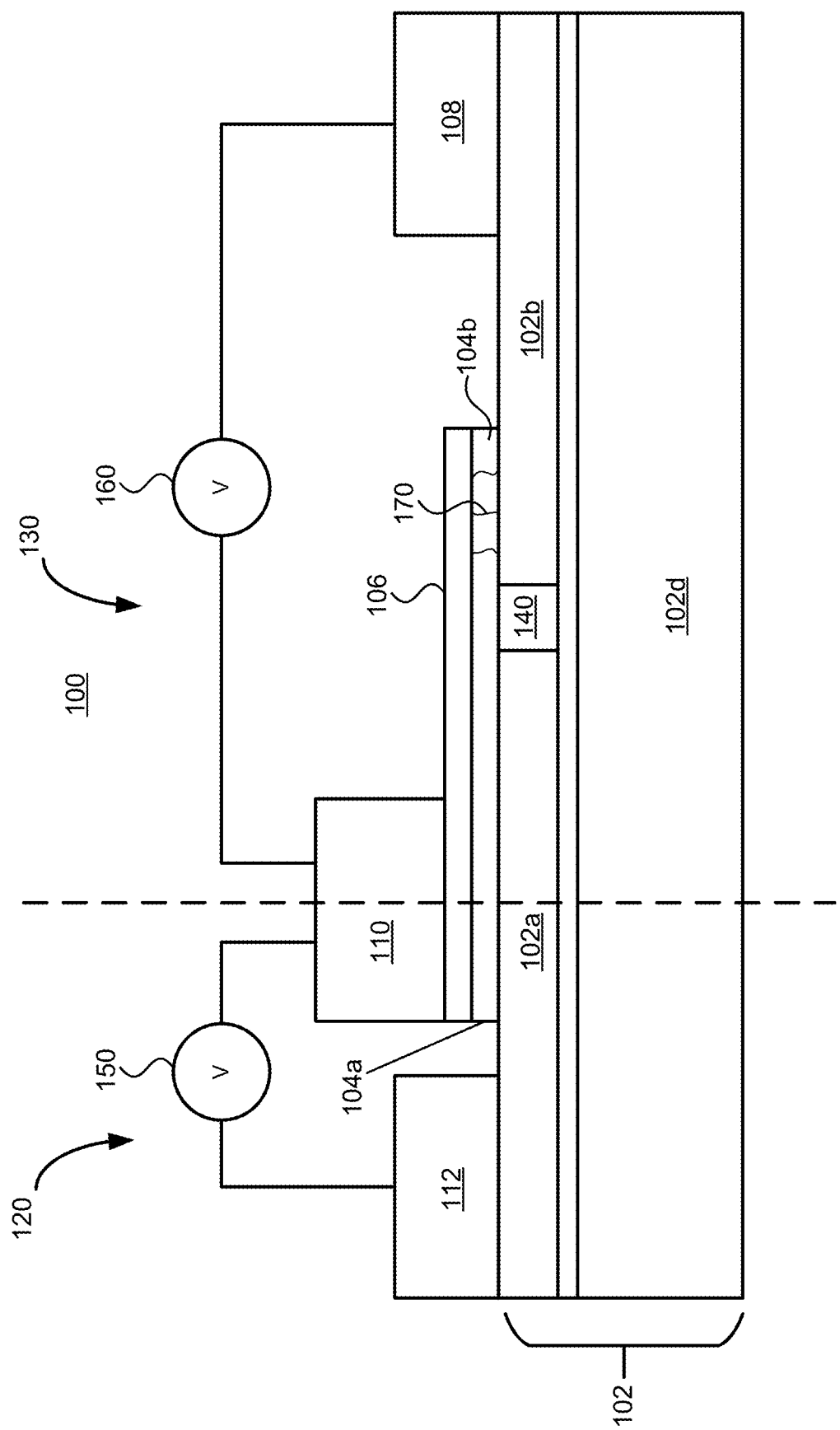
FIG. 1 is a diagram illustrating a cross-sectional view of an optical device, according to one example embodiment.

Reference is now made to FIG. 1. FIG. 1 is a diagram illustrating a cross-sectional view of an optical device 100, according to one example embodiment. The optical device 100 includes a substrate 102, a dielectric layer 104 (including a first portion 104a and a second portion 104b), a first semiconductor layer 106, a first electrode 108, a second electrode 110 and a third electrode 112. In some embodiments, the substrate 102 may be a semiconductor substrate such a silicon substrate, a germanium substrate, a silicon-germanium substrate, a silicon-on-insulator (SOI) substrate, a GaN substrate, a GaAs substrate, etc. In the illustrated embodiment in FIG. 1, the substrate 102 is a SOI substrate that includes a semiconductor (e.g., Si) layer 102a and 102b, a buried oxide (BOX) layer 102c, and a silicon wafer 102d. Although a Si layer is illustrated, other semiconductor materials may be employed.

The Si layer includes a first portion 102a and a second portion 102b respectively corresponding to a light-emitting device 120 and a memory device 130. The first portion 102a and the second portion 102b of the Si layer are separated by an insulating medium 140. The first portion 102a and the second portion 102b may be undoped or doped with a dopant. In some embodiments, when the first portion 102a and the second portion 102b are doped, they may be doped with a dopant of the same type. For example, they can be doped with a P-type dopant or an N-type dopant. In some embodiments, the first portion 102a and the second portion 102b may be doped with different types of dopants. For example, the first portion 102a is doped with a P-type dopant while the second portion 102b is doped with a N-type dopant, or vice versa.

The dielectric layer 104 includes a first portion 104a and a second portion 104b disposed on the first portion 102a and the second portion 102b of the Si layer, respectively. The dielectric layer 104 may include one or more of silicon dioxide, silicon nitride, and metal oxides, such as $Al_2O_3$, $HfO_2$, or $ZrO_2$. In some embodiments, the dielectric layer 104 may include one or more mutually stacked oxide thin films. For example, the dielectric layer 104 may be a stack of $SiO_2/HfO_2/Al_2O_3$ thin films. As non-limiting examples, a thickness of the dielectric layer 104 may be 1-10 nm, less than 8 nm, less than 6 nm, or less than 4 nm. The insulating medium 140 may contain air or other insulating materials, such as silicon dioxide, silicon nitride, silicon oxynitride, TEOS, etc. One purpose of the insulating medium 140 is to separate the first portion 102a and the second portion 102b of the Si layer such that the light-emitting device 120 and the memory device 130 can be controlled separately. In some embodiments, when the insulating medium 140 is an air trench, the first portion 104a and the second portion 104b of the dielectric layer 104 may be separated by the insulating medium 140. In other embodiments (as illustrated), the dielectric layer 104 can be a continuous layer.

The first semiconductor layer 106 is disposed on the first portion 104a and the second portion 104b of the dielectric layer 104. The first semiconductor layer 106 bridges the first portion 102a and the second portion 102b of the Si layer, and extends over the insulating medium 140. The first semiconductor layer 106 includes a light-emitting structure configured to emit light. As a non-limiting example, the first semiconductor layer 106 may include a PN junction. In some embodiments, the first semiconductor layer 106 may include a III-V material and at least a dopant. The dopant for the first semiconductor layer 106 may be a type opposite to a type of the dopant for the second portion 102b of the Si layer. For example, when the second portion 102b of the Si layer is doped with a P-type dopant, the portion of the first semiconductor layer 106 corresponding to the second portion 102b of the Si layer is doped with an N-type dopant, or vice versa.

The second electrode 110 is disposed on the first semiconductor layer 106, while the third electrode 112 is disposed on the first portion 102a of the Si layer and the first electrode 108 is disposed on the second portion 102b of the Si layer. In some embodiments, the third electrode 112 may be directly connected to the lower surface of the first semiconductor layer 106, while the second electrode 110 is directly connected to the upper surface of the first semiconductor layer 106. A power source/supply 150 is provided to the light-emitting device 120 and is coupled to the second electrode 110 and the third electrode 112. Another power source/supply 160 is provided to the memory device 130 and is coupled to the second electrode 110 and the first electrode 108. Although the power sources/supplies 150 and 160 are illustrated in FIG. 1 as separate units, in some embodiments they can be integrated as one unit. In some embodiments, the power sources/supplies 150 and 160 may each be a current source or a voltage source.

In the illustrated embodiment of FIG. 1, the first portion 102a of the Si layer, the first portion 104a of the dielectric layer 104, the first semiconductor layer 106, the second electrode 110, the third electrode 112, and the power source 150 constitute the light-emitting device 120 of the optical device 100. The memory device 130 is connected in series with the light-emitting device 120. The memory device 130 includes the second portion 102b of the Si layer, the second portion 104b of the dielectric layer 104, the first semiconductor layer 106, the second electrode 110, the first electrode 108, and the power source 160. In some embodiments, during manufacturing of the optical device 100, the light-emitting device 120 and the memory device 130 may share the same Si layer, the dielectric layer 104, the first semiconductor layer 106, and the second electrode 110.

In some embodiments, the second portion 102b of the Si layer, the second portion 104b of the dielectric layer 104, and the first semiconductor layer 106 of the memory device 130 form a non-volatile memristor that can be employed as an optical memory unit. At the same time, operations of the memristor can modulate the light-emitting device 120 for generating optical signals. The details of these operations are described hereinafter.

As a non-limiting example, the light-emitting device 120 can be turned on when the power source/supply 150 provides a voltage between the second electrode 110 and the third electrode 112. This causes the light-emitting device 120 to emit light of a first wavelength. The power source/supply 160 can provide another voltage between the second electrode 110 and the first electrode 108 to cause the memory device to be set to the OFF state. Providing the voltage to the memory device 130 when the memory device 130 is at the OFF state may cause the light-emitting device 120 to emit light of a second wavelength, which is shorter than the first wavelength. This is called blueshift. Or the power source/supply 160 can provide another voltage between the second electrode 110 and the first electrode 108 to cause the memory device to be set to the ON state. Providing the voltage to the memory device 130 when the memory device 130 is at the ON state may cause the light-emitting device 120 to emit light of a third wavelength, which is longer than the first wavelength. This is called redshift.

The power source/supply 160 can provide voltages to set and reset the memory device 130. As a non-limiting example, the memory device 130 can be set and reset through the creation and destruction of micro conducting paths 170 in the dielectric layer 104b. In some embodiments, the memory device may be set at a voltage of 4 to 5 volts and reset at a voltage of −2 to −3 volts. At the set stage, the micro conducting paths 170 are created in the dielectric layer 104b, while at the reset stage the micro conducting paths 170 are ruptured in the dielectric layer 104b. The memory device 130 can be set and reset through other mechanisms. For example, depending on the specific materials and interface chemistry, memory device 130 can switch through either "bulk" mechanisms (e.g., more uniform changes throughout the dielectric layer 104b) or fully "interface" mechanisms (e.g., the changes happen right at the interface between the layers, such as changes in Schottky barrier heights).

Figure 2:
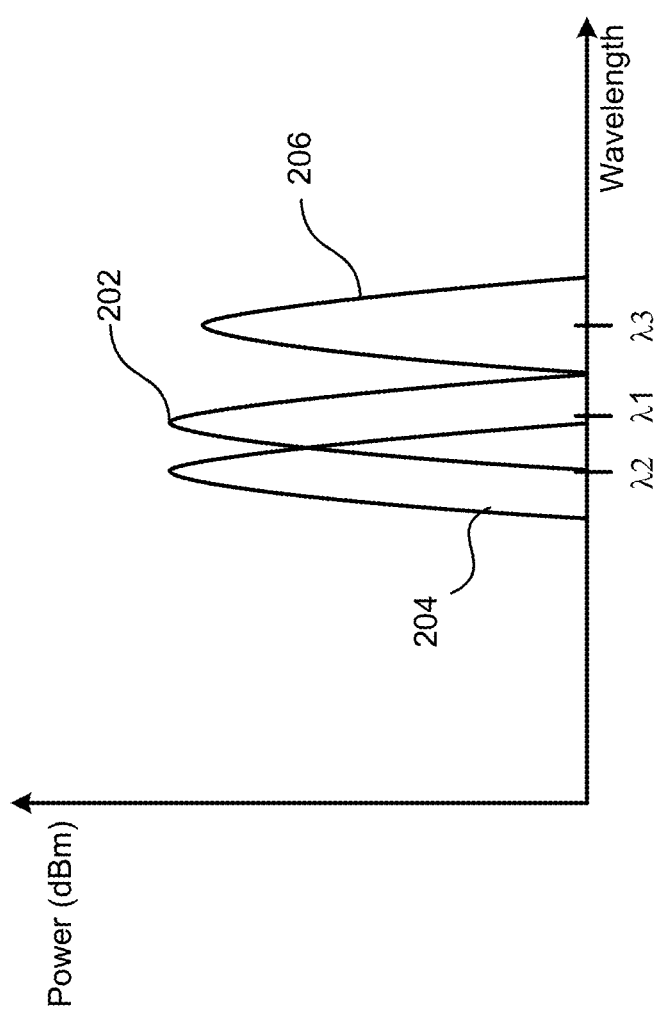
FIG. 2 is a diagram showing wavelengths of a light-emitting device under different operation conditions of a memory device, according to one example embodiment.

FIG. 2 is a diagram showing wavelengths of the light-emitting device 120 under different operation conditions of the memory device 130, according to one example embodiment. Curve 202 indicates a wavelength distribution of the light-emitting device 120 when zero voltage is provided to the memory device 130 while the memory device 130 is at the OFF state. The wavelength distribution curve 202 has a central wavelength (or wavelength at the peak power) $\lambda 1$. Curve 204 indicates a wavelength distribution of the light-emitting device 120 when a non-zero voltage is provided to the memory device 130 while the memory device 130 is at the OFF state. The wavelength distribution curve 204 has a central wavelength (or wavelength at the peak power) $\lambda 2$ that is shorter than the wavelength $\lambda 1$. That is, providing a non-zero voltage to the memory device 130 at the OFF state causes the light emitting device 120 to emit light of a shorter wavelength (blueshift).

Curve 206 indicates a wavelength distribution of the light-emitting device 120 when a non-zero voltage is provided to the memory device 130 while the memory device 130 is at the ON state. The wavelength distribution curve 206 has a central wavelength (or wavelength at the peak power) $\lambda 3$ that is longer than the wavelength $\lambda 1$. That is, providing a non-zero voltage to the memory device 130 at the ON state causes the light emitting device 120 to emit light of a longer wavelength (redshift). In some embodiments, when providing the same non-zero voltage to the memory device 130 as the memory device 130 is operated at ON or OFF state, the redshift is greater than the blueshift, i.e., $|\lambda 1-\lambda 3|>|\lambda 1-\lambda 2|$. In some embodiments, the power of the redshift peak at wavelength $\lambda 3$ is less than the power of the redshift peak at wavelength $\lambda 2$ or the power at wavelength $\lambda 1$.

In some embodiments, when providing the same non-zero voltage to the memory device 130 as the memory device 130 is operated at ON or OFF state, the redshift is substantially equal to the blueshift. In yet some embodiments, when providing the same non-zero voltage to the memory device 130 as the memory device 130 is operated at ON or OFF state, the redshift is less than the blueshift, i.e., $|\lambda 1-\lambda 3|<|\lambda 1-\lambda 2|$. A number of factors may affect wavelength shifts, for example, the materials, quality, and thicknesses for the dielectric layer 104a, the doping concentrations of the first semiconductor layer 106, the doping materials of the first semiconductor layer 106, the doping concentrations of the second semiconductor (e.g., Si) layer 102a, 102b, the doping materials of the second semiconductor layer 102a, 102b, the materials of the first semiconductor layer 106, the materials of the second semiconductor layer 102a, 102b, and/or the width and materials of the insulating medium 140. Based on these factors, one of ordinary skill in the art would be able to modify the above examples to modulate the light from light-emitting device 120 through the operations of the memory device 130.

When the memory device 130 is at ON state, increasing the bias (a voltage less than the set/reset voltages) to the memory device 130 increases the magnitude of the redshifts. Similarly, when the memory device 130 is at OFF state, increasing the bias to the memory device 130 increases the magnitude of the blueshifts. In some embodiments, the tuning range of the redshifts are greater than that of the blueshifts.

Figure 3:
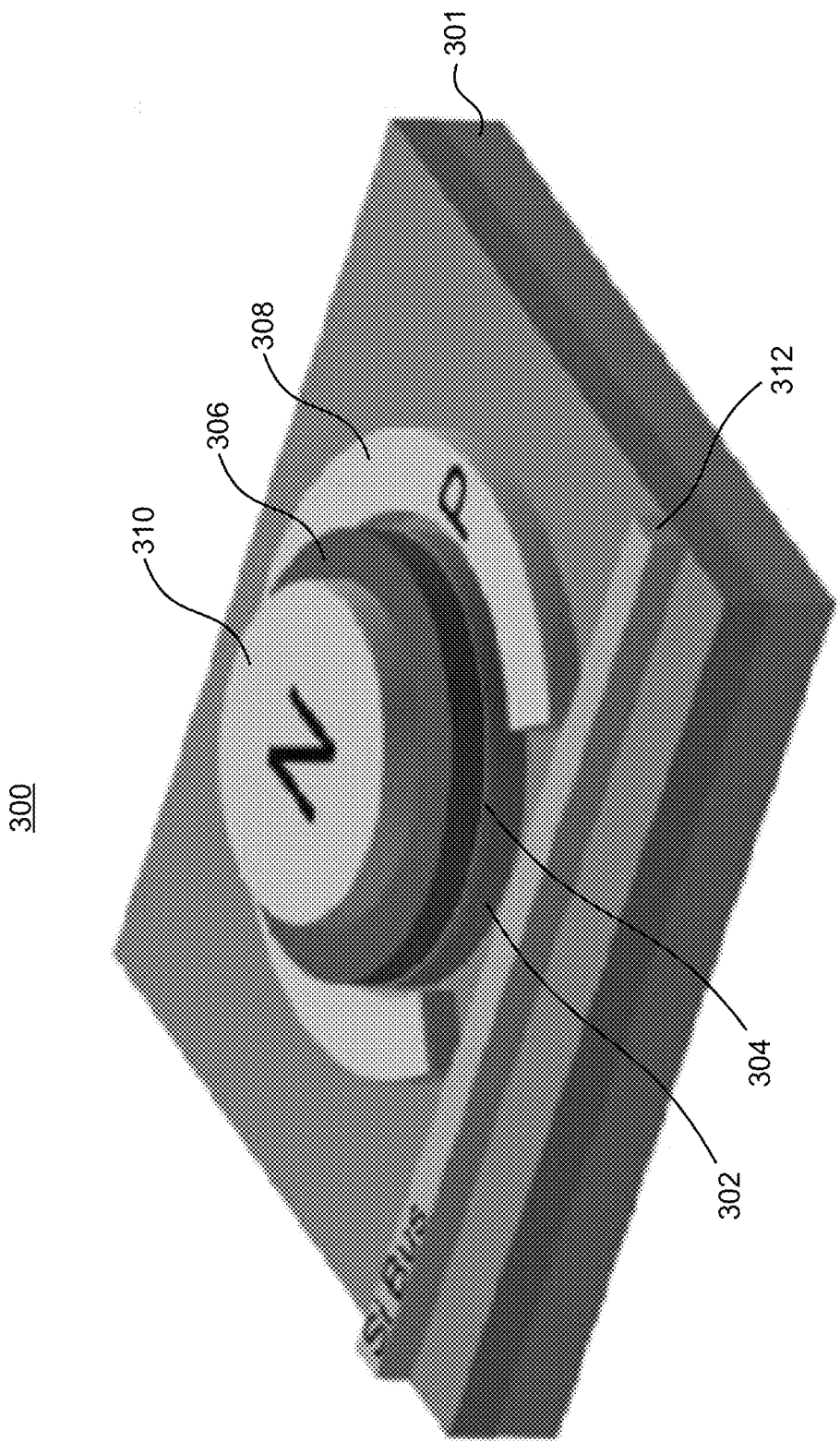
FIG. 3 is a diagram illustrating a perspective view of an optical device, according to one example embodiment.

FIG. 3 is a diagram illustrating a perspective view of an optical device 300, according to one example embodiment. The optical device 300 includes a substrate 301, a first semiconductor layer 302 disposed on the substrate 301, a dielectric layer 304 disposed on the first semiconductor layer 302, a second semiconductor layer 306 disposed on the dielectric layer 304, a first electrode 308 (e.g., a P electrode), a second electrode 310 (e.g., an N electrode), a third electrode (not visible, on the back of the substrate 301), and an optical waveguide 312. The optical device 300 includes a light-emitting device and a memory device, similar to the optical device 100 of FIG. 1. The light-emitting device is composed of the first semiconductor layer 302, the dielectric layer 304, the second semiconductor layer 306, the second electrode 310, and the third electrode coupled to the other side of the first semiconductor layer 302. The light emitted from the light-emitting device can be transmitted through the optical waveguide 312. In some embodiments, the optical waveguide 312 may be form with a silicon layer (labeled in FIG. 3 as Si Bus). The optical waveguide 312 may facilitate communications of optical signals of the optical device 300 to another destination. Different signals carried by different wavelengths can also propagate in the same optical waveguide to enable large bandwidth optical communication techniques, such as wavelength division modulation (WDM). The memory device may share the same the first semiconductor layer 302, the dielectric layer 304, the second semiconductor layer 306, and the second electrode 310 with the light-emitting device. The first electrode 308 is provided for operating the memory device.

Figure 4:
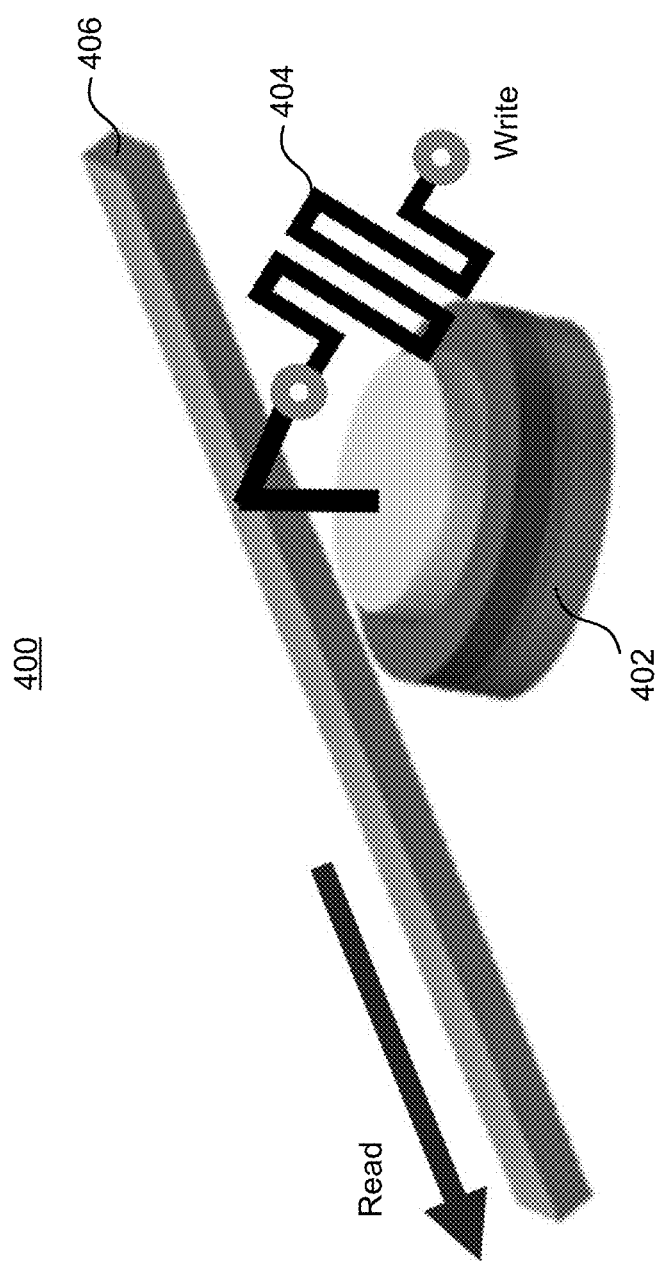
FIG. 4 is a schematic diagram illustrating an optical device, according to one example embodiment.

FIG. 4 is a schematic diagram illustrating an optical device 400, according to one example embodiment. The optical device 400 includes a laser device 402, a memory device 404, and an optical waveguide 406. The laser device 402 is coupled with the memory device 404 in series. In some embodiments, the memory device 404 may be a non-volatile memristor. The light emitted from the laser device 402 is transmitted through optical waveguide 406. The configuration of optical device 400 enables the memory device 404 to be electrically written and optically read. The laser device 402 may be made from III-V materials and is integrated on silicon with thin dielectric (e.g., oxide) layers. The memory device 404 is simultaneously made from the same III-V, oxide, and silicon layers. This creates a pathway for optical data storage in specific applications such as optoelectronic CAM and RAM, optical latches, and flip-flops. The disclosed techniques can, for example, strengthen the energy-efficiency and speed of optical computers. Other applications are contemplated. For example, the optical device 400 can be used to emulate photonic neural synapses for neural networks and neuromorphic computing applications.

As a non-limiting example, to form the optical device 400, III-V epitaxial layers (e.g. the first semiconductor layer 106 of FIG. 1), which may be InP-based compound semiconductors, are transferred to a Si-on-insulator (SOI) substrate (e.g., the substrate 102 of FIG. 1) by a wafer bonding process to create a hybrid silicon MOS-type microring laser. Although a microring laser is provided as an example, this disclosure is not so limited. Other types of laser devices can be employed in the optical device 400, such as Fabry-Perot cavity lasers, distributed Bragg reflector (DBR) lasers, distributed feedback (DFB) lasers, etc. The oxide interface layer (e.g., the dielectric layer 104) that bonds the epitaxial layers to the SOI substrate makes up the gate dielectric (e.g., dielectric layer 104b), which along with the Si and III-V layers, form a MOS capacitor for a memristor. The electrodes (e.g., the first electrode 108 and the second electrode 110 of FIG. 1) are placed on N-type InP and P-type Si to apply an electrical field across the gate dielectric. The refractive index and free-carrier absorption loss in the InP and Si layers then change as a result of free carriers accumulating or depleting near the gate dielectric under an external bias.

The hybrid MOS capacitor operates as a memristor (e.g., the memory device 404). When applying a high electric field across the dielectric layer, electroforming occurs as a conductive path is created within the dielectric layer, causing for the memory device 404 to switch from a capacitor to a resistor. Afterwards, the memristor can be read through the current at low bias voltages. The current read at this ON state is higher. When applying a high electric field in the opposite polarity, the conductive path previously created is ruptured, and the dielectric once again acts like an insulator to enter the OFF state. Therefore, the current read at this state, is significantly lower than it is in the ON state.

The resonance wavelength of the laser device 402 switches between two different wavelengths in the ON state and the OFF state. Therefore, the optical device 400 can be used to electrically write and store data by switching the conductivity of the oxide layer within the MOS capacitor. In the OFF state, the accumulation of carriers in the III-V and Si layers create a carrier density in the waveguide that changes the optical refractive index of the waveguide. A 0 or 1 state can be stored based on the state of the memristor, and the data that is stored can be optically read by measuring the optical power transmitted through the bus waveguide 406 coupled to the laser device 402.

In some embodiments, additionally or alternatively, the memristor 404 may be employed as a heater to modulate the laser device 402. For example, operating memristor 404 may generate heat that can change the refraction index of the laser device 404 to modulate light emission of the laser device 404. With this technique, it is possible to modulate the laser device 402 with the memristor 404 as a heat source.

In current computer architectures, the von Neumann bottleneck limits the bandwidth in the interconnects between the memory and CPU. Furthermore, power consumption in CMOS chips continues to increase due to heat-dissipating conventional metal interconnects and leakage current in transistors. In order to solve these issues, silicon photonics has emerged as a promising method to create a high-bandwidth, energy-efficient optical interconnect for high-performance computers. Additionally, devices such as memristors can offer an alternative to non-volatile flash memory and open up a new computing routes such as in-memory computing. Integrating these technologies together can further shorten the bridge between the CPU and memory, mitigating the von Neumann bottleneck, and enabling an energy-efficient, high-speed memory-driven computer.

The techniques disclosed herein integrate memristors with laser diodes. The configuration can bypass the optical to electrical conversion between photonic integrated circuits and memory chips, lowering the latency and power consumption of the communication links. The techniques can be used in an optoelectronic computer where information is generated by electronics, and communicated using optical interconnects, processed using optical logic gates, and stored with memristors. Applications of this technology include an optically accessible memory chips with ultrafast read times. Furthermore, this enables a neuromorphic computer using large scale silicon photonic technology, which can be advantageous to electronics in its ability to create high-bandwidth, low-energy interconnects with minimal crosstalk.

Figure 5:
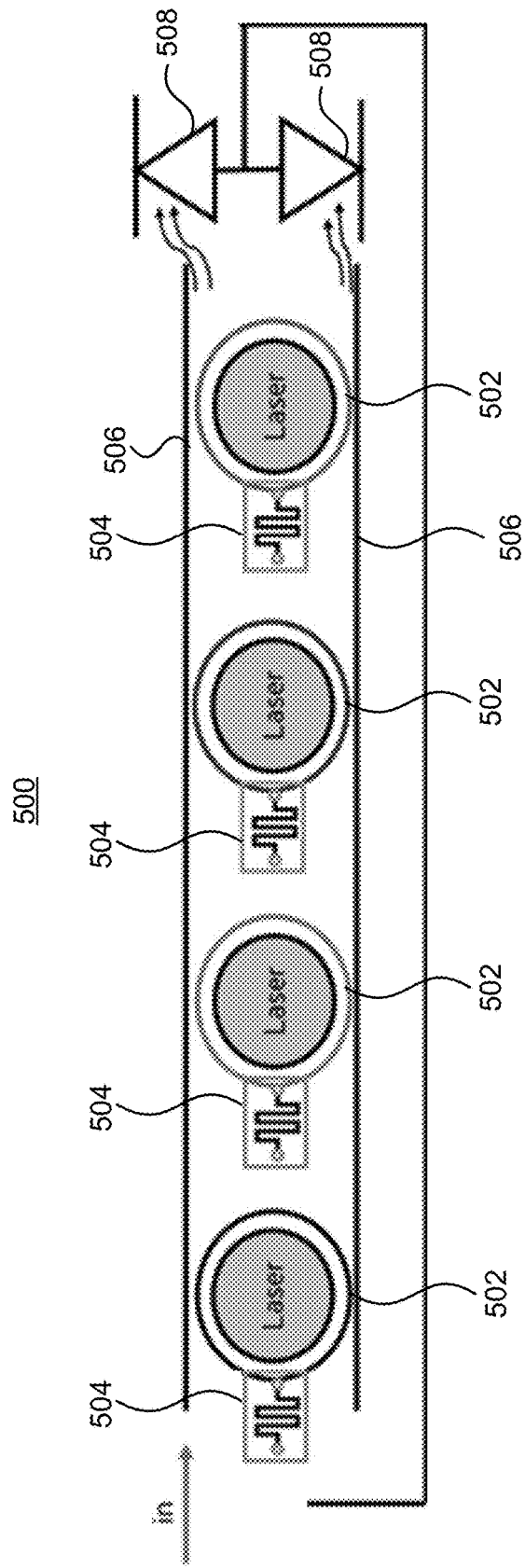
FIG. 5. is a diagram showing a circuit schematic of a photonic neuron, according to one example embodiment FIG. 6. is a diagram showing a circuit schematic of a memory device that has a 4-bit word stored electrically and read optically, according to one example embodiment.

The memristors can alternate between different states/resistance levels, and the lasers can then change its resonance wavelength according to the resistance level of the memristors which affect memristors' optical refractive index. A memristor can have a variable resistance level based on how high the set voltage for the memristor is. The different resistance levels of the memristor have correspondingly different resonant values for the lasers because of changes of refraction index and free-carrier loss of the lasers. Each laser then has multiple states, which can be useful for analog computing applications such as neuromorphic computing. The lasers can be integrated with a balanced photodetector to create a photonic neuron 500 as shown in FIG. 5, according to one example embodiment. The photonic neuron 500 includes a plurality of microring lasers 502, and a plurality of memristors 504, where each microring laser 502 is coupled to a memristor 504. Each of the lasers 502 may emit a different wavelength of light. It should be understood that although four microring lasers 502 and four memristors 504 are illustrated in FIG. 5, this disclosure does not limited to these configurations. It should be clear that more or fewer than those illustrated can be employed to form the photonic neuron 500. The light emitted from the lasers 504 are guided by the optical waveguides 506 and detected by the photodetectors 508. The circuit of integrated memristors 504 and the lasers 502 with balanced photodetector 508 creates a non-volatile microring weight bank that can used to model a neuron.

Figure 6:
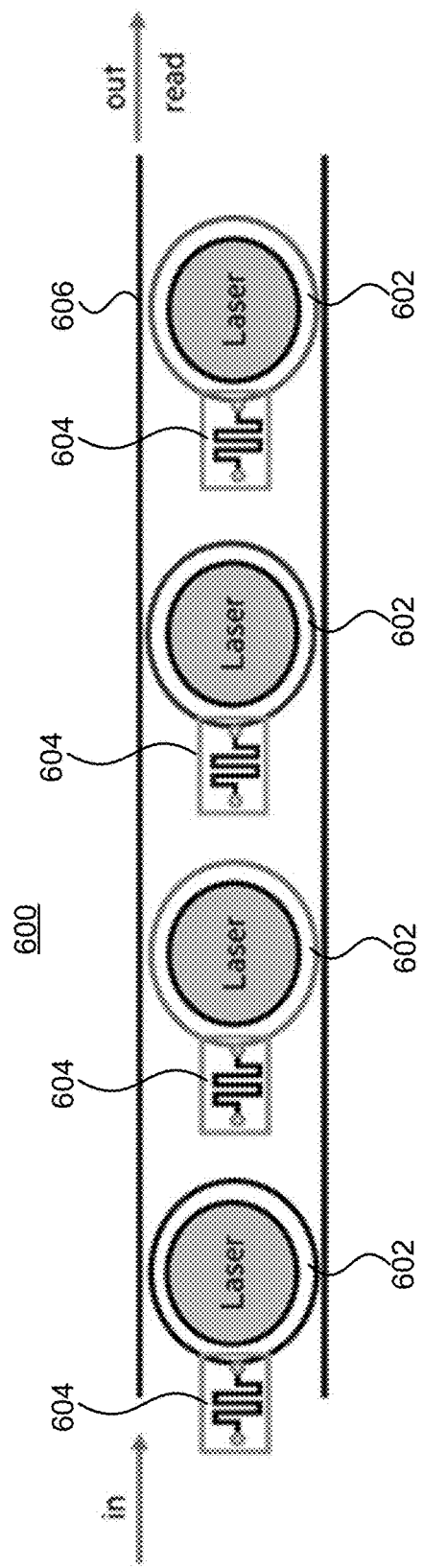

FIG. 6. is a diagram showing a circuit schematic of a memory device 600 that has a 4-bit word stored electrically and read optically, according to one example embodiment. The memory device 600 includes a plurality of microring lasers 602, and a plurality of memristors 604. Each of the lasers 602 is configured to emit a different wavelength of light. It should be understood that although four microring lasers 602 and four memristors 604 are illustrated in FIG. 6, this disclosure does not limited to these numbers. To create a memory device that can store more bit words, more microring lasers 602 and memristors 604 may be added. The memory device 600 also includes a pair of optical waveguides 606. In operation, bit words are electrically written in the memristors 604. The bit words can be read by a reading light beam input from one end (e.g., left end in FIG. 6) of the optical waveguide 606, while the lasers 602 are operated to emit light. The resulting light signals can be read from the other end (e.g., right end in FIG. 6) of the optical waveguide 606.

Figure 7:
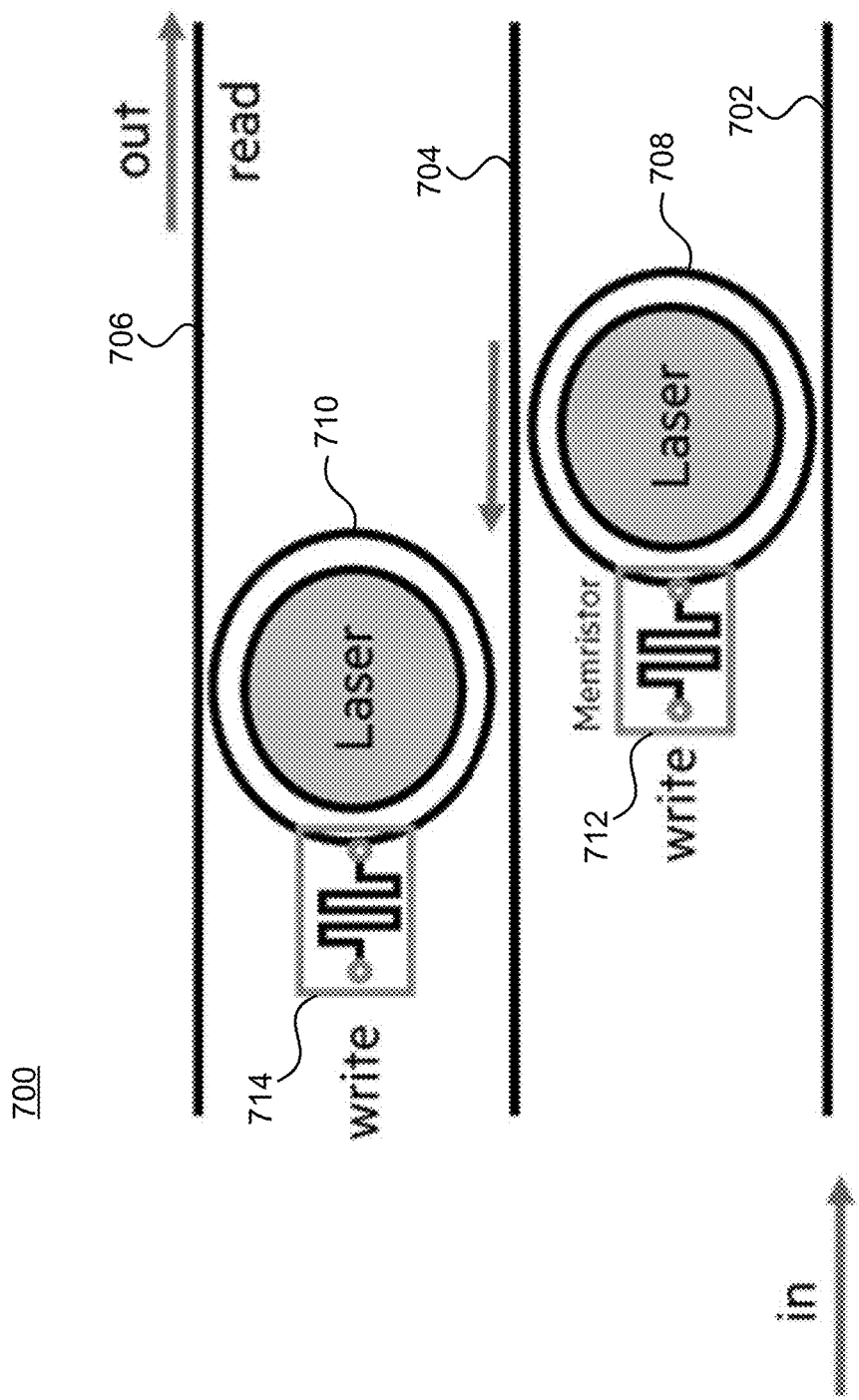
FIG. 7. is a diagram showing a circuit schematic of an optical set-reset latch, according to one example embodiment.

FIG. 7. is a diagram showing a circuit schematic of an optical set-reset latch 700, according to one example embodiment. The latch 700 includes a first optical waveguide 702, a second optical waveguide 704, a third optical waveguide 706, a pair of microring lasers 708, 710, and a pair of memristors 712, 714. In operation, state data are electrically written in the memristors 712, 714. In the illustrated embodiment in FIG. 7, a light signal is input from left end of the first optical waveguide 702, and is modulated by the microring laser 708 under the influence of the memristor 712. An output of the microring laser 708 is captured by the second optical waveguide 704. The signal on the second optical waveguide 704 is modulated by the microring laser 710 under the influence of the memristor 714. An output of the microring laser 710 is captured by the third optical waveguide 706 and can be read at the right end of the third optical waveguide 706.

In summary, the optical devices disclosed herein can integrate optical data communication links seamlessly with memory within a computer, allowing for faster and more energy-efficient data storage and transmission. Processors, interconnects, and memory can all be integrated onto one optical chip using the techniques disclosed herein. The disclosed optical device includes memory that has longer retention than memory devices utilizing charge trapping, since charges would be discharged within the disclosed optical device longer than it may take for an ion to migrate back to its original state. These memristors can be easily integrated into silicon photonics devices to improve their functionalities.

The optical devices disclosed herein can be fundamental building blocks for various novel circuits and applications in optical computing. Various types of optical logic gates, latches, and flip-flops can be made using the disclosed optical devices to produce an optical arithmetic logic unit (ALU). These optical devices can be used to produce artificial neurons, which can be implemented into neuromorphic computing systems for deep learning and artificial intelligence. Photonics enables a higher bandwidth and lower-energy platform for neuromorphic computing systems than electronics, which can reach closer to the energy-efficiency and processing power of the human brain.

Moreover, these devices are potentially CMOS compatible, allowing for high-volume, low-cost manufacturing.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality.

In common usage, the term "or" should always be construed in the inclusive sense unless the exclusive sense is specifically indicated or logically necessary. The exclusive sense of "or" is specifically indicated when, for example, the term "or" is paired with the term "either," as in "either A or B." As another example, the exclusive sense may also be specifically indicated by appending "exclusive" or "but not both" after the list of items, as in "A or B, exclusively" and "A and B, but not both." Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. An optical device, comprising:
a light-emitting device disposed on a substrate through a dielectric layer, the light-emitting device including a first semiconductor layer configured to emit light, wherein the substrate comprises a second semiconductor layer in contact with the dielectric layer;
a memory device integrated with the light-emitting device, wherein the memory device includes the first semiconductor layer of the light-emitting device, the dielectric layer, and the substrate, wherein the second semiconductor layer has a first portion for the light-emitting device and a second portion for the memory device, wherein the memory device comprises a first electrode coupled to the second portion of the second semiconductor layer and a second electrode coupled to the first semiconductor layer, and the light-emitting device comprises a third electrode coupled to the first portion of the second semiconductor layer and the second electrode; and
a power source configured to:
provide a first voltage between the second electrode and the third electrode to cause the light-emitting device to emit light of a first wavelength and provide a second voltage between the first electrode and the second electrode while the memory device is at OFF state to cause the light-emitting device to emit light of a second wavelength shorter than the first wavelength; and
provide the first voltage between the second electrode and the third electrode to cause the light-emitting device to emit light of the first wavelength and provide the second voltage between the first electrode and the second electrode while the memory device is at ON state to cause the light-emitting device to emit light of a third wavelength longer than the first wavelength.

2. The optical device of claim 1, wherein the first portion and the second portion of the second semiconductor layer are separated by an insulating medium.

3. The optical device of claim 2, wherein the insulating medium comprises air.

4. The optical device of claim 2, wherein the insulating medium comprises a dielectric material.

5. The optical device of claim 2, wherein the first semiconductor layer comprises a III-V material and a dopant of a first type, and the second semiconductor layer includes a dopant of a second type opposite to the first type.

6. The optical device of claim 5, wherein the second semiconductor layer comprises silicon.

7. The optical device of claim 1, wherein the dielectric layer comprises one or more of metal dielectrics and silicon dielectrics.

8. The optical device of claim 1, wherein the first semiconductor layer bridges the first portion of the second semiconductor layer and the second portion of the second semiconductor layer, and extends over the insulating medium.

9. The optical device of claim 1, wherein a difference between the third wavelength and the first wavelength is greater than a difference between the first wavelength and the second wavelength.

10. The optical device of claim 1, further comprising a waveguide disposed adjacent to the light emitting device and configured to transmit light from the light-emitting device.

11. An optical device, comprising:
a laser device disposed on a silicon-on-insulator (SOI) substrate through a dielectric layer, the laser device including a first semiconductor layer configured to emit light, wherein the SOI substrate includes a silicon layer in contact with the dielectric layer;
a memory device integrated with the laser device, wherein the memory device includes the first semiconductor layer of the laser device, the dielectric layer, and the silicon layer, wherein the silicon layer has a first portion corresponding to the laser device and a second portion corresponding to the memory device, wherein the memory device comprises a first electrode coupled to the second portion of the silicon layer and a second electrode coupled to the first semiconductor layer, and the laser device comprises a third electrode coupled to the first portion of the silicon layer and the second electrode; and
a power source configured to:
provide a first voltage between the second electrode and the third electrode to cause the laser device to emit light of a first wavelength and provide a second voltage between the first electrode and the second electrode while the memory device is at OFF state to cause the laser device to emit light of a second wavelength shorter than the first wavelength; and
provide the first voltage between the second electrode and the third electrode to cause the laser device to emit light of the first wavelength and provide the second voltage between the first electrode and the second electrode while the memory device is at ON state to cause the laser device to emit light of a third wavelength longer than the first wavelength.

12. The optical device of claim 11, wherein the first portion and the second portion of the silicon layer are separated by an insulating medium.

13. The optical device of claim 12, wherein the insulating medium comprises air.

14. The optical device of claim 12, wherein the insulating medium comprises a dielectric material.

15. The optical device of claim 12, wherein the first semiconductor layer bridges the first portion of the silicon layer and the second portion of the silicon layer, and extends over the insulating medium.

16. The optical device of claim 11, wherein the first semiconductor layer comprises a III-V material and a dopant of a first type.

17. The optical device of claim 16, wherein the silicon layer includes a dopant of a second type opposite to the first type.

18. The optical device of claim 11, wherein the dielectric layer comprises one or more of metal dielectrics and silicon dielectrics.

19. The optical device of claim 11, wherein a difference between the third wavelength and the first wavelength is greater than a difference between the first wavelength and the second wavelength.

20. The optical device of claim 11, further comprising a waveguide disposed adjacent to the laser device and configured to transmit light from the laser device.

* * * * *